United States Patent
Nishiyama et al.

(10) Patent No.: US 7,898,813 B2
(45) Date of Patent: Mar. 1, 2011

(54) SEMICONDUCTOR MEMORY DEVICE AND SEMICONDUCTOR MEMORY CARD USING THE SAME

(75) Inventors: Taku Nishiyama, Yokohama (JP); Kiyokazu Okada, Yokkaichi (JP); Yoriyasu Ando, Yokkaichi (JP); Tetsuya Yamamoto, Kamakura (JP); Naohisa Okumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 832 days.

(21) Appl. No.: 11/767,801

(22) Filed: Jun. 25, 2007

(65) Prior Publication Data
US 2008/0316696 A1 Dec. 25, 2008

(51) Int. Cl.
*H05K 1/14* (2006.01)
(52) U.S. Cl. .................. 361/737; 361/820; 361/735
(58) Field of Classification Search .......... 361/737, 361/727, 752, 790, 797, 800, 807, 810, 301.4, 361/820, 735; 174/106 SC; 257/686, 698, 257/778
See application file for complete search history.

(56) References Cited

U.S. PATENT DOCUMENTS

| | | | |
|---|---|---|---|
| 6,359,340 B1 * | 3/2002 | Lin et al. | 257/777 |
| 6,538,331 B2 * | 3/2003 | Masuda et al. | 257/777 |
| 6,777,797 B2 * | 8/2004 | Egawa | 257/686 |
| 6,836,021 B2 * | 12/2004 | Ishikawa et al. | 257/777 |
| 6,972,487 B2 * | 12/2005 | Kato et al. | 257/723 |
| 7,061,105 B2 * | 6/2006 | Masuda et al. | 257/723 |
| 7,622,799 B2 * | 11/2009 | Kuroda et al. | 257/686 |
| 7,633,763 B1 * | 12/2009 | Park et al. | 361/760 |

OTHER PUBLICATIONS

U.S. Appl. No. 12/343,921, filed Dec. 24, 2008, Nishiyama, et al.
U.S. Appl. No. 12/238,983, filed Sep. 26, 2008, Nishiyama, et al.
U.S. Appl. No. 12/393,655, filed Feb. 26, 2009, Yamamoto.

* cited by examiner

*Primary Examiner*—Hung S Bui
(74) *Attorney, Agent, or Firm*—Oblon, Spivak, McClelland, Maier & Neustadt, L.L.P.

(57) ABSTRACT

A semiconductor memory device is provided with a wiring board which includes an element mounting portion and connection pads. Plural semiconductor memory elements are stacked on the element mounting portion of the wiring board. The semiconductor memory element of a lower side has a thickness greater than that of the semiconductor memory element of an upper side. The semiconductor memory elements are electrically connected to the connection pads of the wiring board via metal wires.

20 Claims, 4 Drawing Sheets

SEMICONDUCTOR MEMORY DEVICE AND SEMICONDUCTOR MEMORY CARD USING THE SAME

BACKGROUND OF THE INVENTION

1. Field of the Invention

The present invention relates to a semiconductor memory device and a semiconductor memory card using the same.

2. Description of the Related Art

A semiconductor memory card having a built-in NAND-type flash memory is being miniaturized and provided with a high capacity rapidly. For example, an SD memory card is available in three card sizes such as an ordinary SD™ card size, a Mini SD card size and a Micro SD™ card size, and the Micro SD™ card is also demanded to have a high capacity. To realize a miniaturized memory card, it is being studied that the memory card is independently configured without housing it into a casing such as a base card, and such a card has been partly put in practical use.

A semiconductor memory card without a casing has external connection terminals formed on a surface of a wiring board by electrolytic plating or the like. Semiconductor elements such as a memory element and a controller element are stacked on the back surface of the wiring board. The semiconductor elements are electrically connected to the wiring board. The semiconductor elements mounted on the wiring board are sealed by a resin by mold forming. Such a semiconductor device is not housed into a casing but dependently used to configure a casing-free semiconductor memory card.

The casing-free semiconductor memory card is also demanded to be provided with a high storage capacity. Therefore, it is studied to mount plural memory elements on the wiring board by stacking on it. The size of the semiconductor memory card including its thickness is specified, so that it is necessary to decrease the thickness of each memory element to stack the memory elements into multiple layers. But, if the thickness of the memory elements is merely decreased, there is a possibility that the memory elements are cracked at the time of mold forming of the sealing resin because of an influence of the surface irregularities of the wiring board. Especially, there is a problem that the bottom memory element tends to be cracked among the multilayered memory elements.

SUMMARY OF THE INVENTION

According to an aspect of the present invention, there is provided a semiconductor memory device, comprising a wiring board including a first main surface which has an element mounting portion and connection pads, and a second main surface which is on an opposite of the first main surface; a first semiconductor memory element which is mounted on the element mounting portion of the wiring board and has first electrode pads; a second semiconductor memory element which is stacked on the first semiconductor memory element and has second electrode pads; metal wires which electrically connect the connection pads of the wiring board and the first and second electrode pads of the first and second semiconductor memory elements; and a sealing resin layer which is formed on the first main surface of the wiring board to seal the first and second semiconductor memory elements together with the metal wires, wherein the first semiconductor memory element has a thickness greater than that of the second semiconductor memory element.

According to another aspect of the present invention, there is provided a semiconductor memory card, comprising a wiring board including a first main surface which has an element mounting portion and connection pads, and a second main surface which is on an opposite of the first main surface; an external connection terminal which are formed on the second main surface of the wiring board; a first semiconductor memory element which is mounted on the element mounting portion of the wiring board and has first electrode pads; a second semiconductor memory element which is stacked on the first semiconductor memory element and has second electrode pads; a controller element which is stacked on the second semiconductor memory element and has third electrode pads; first metal wires which electrically connect the connection pads of the wiring board and the first and second electrode pads of the first and second semiconductor memory elements; second metal wires which electrically connect the connection pads of the wiring board and the third electrode pads of the controller element; and a sealing resin layer which is formed on the first main surface of the wiring board to seal the first and second semiconductor memory elements and the controller element together with the first and second metal wires, wherein the first semiconductor memory element has a thickness greater than that of the second semiconductor memory element.

DETAILED DESCRIPTION OF THE INVENTION

Figure 1:
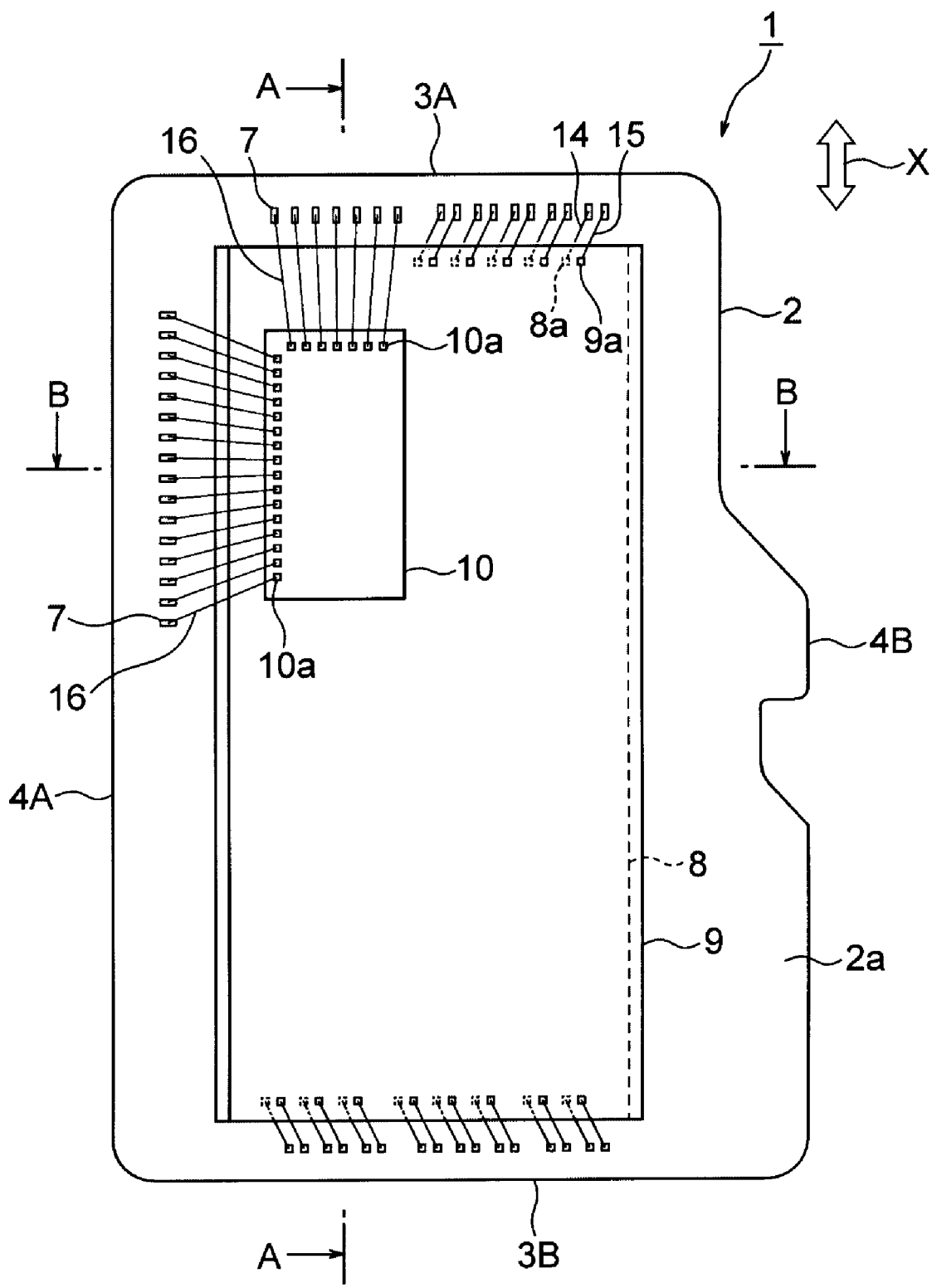
FIG. 1 is a plan view showing a semiconductor memory device according to a first embodiment of the invention.
Figure 2:
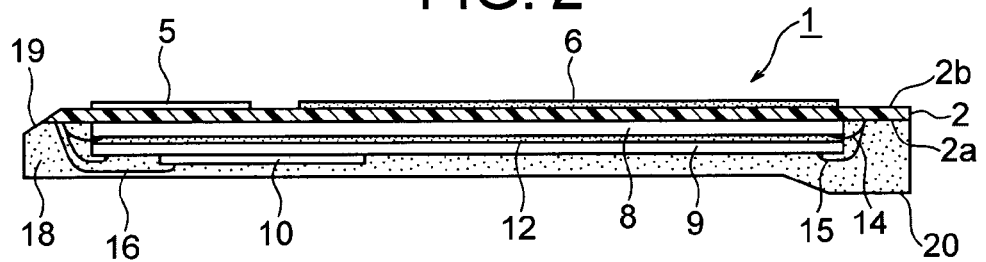
FIG. 2 is a sectional view taken along line A-A of FIG. 1.
Figure 3:
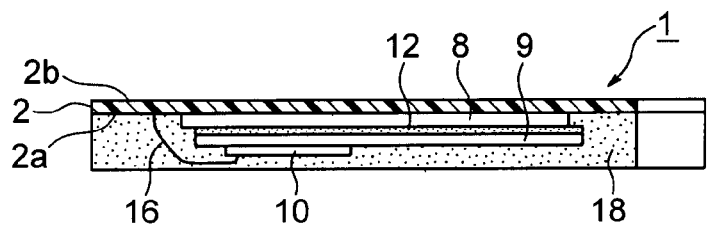
FIG. 3 is a sectional view taken along line B-B of FIG. 1.
Figure 4:
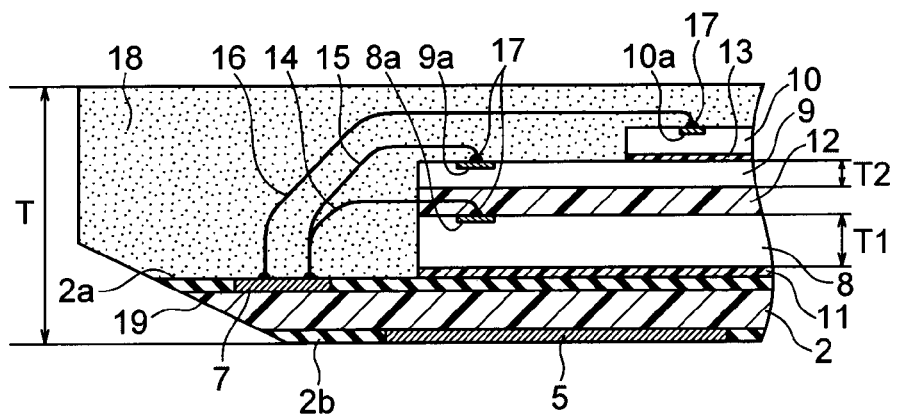
FIG. 4 is a sectional view showing a partly magnified view of FIG. 2.

Modes of conducting the present invention will be described with reference to the drawings. FIG. 1 through FIG. 4 show a structure of a semiconductor memory device according to a first embodiment of the invention. A semiconductor memory device 1 shown in the drawings configures a semiconductor memory card. For example, the semiconductor memory device 1 is solely used as a memory card (Micro SD™ card) according to the Micro SD™ standard. In other words, the semiconductor memory device 1 is a casing-free memory card.

The semiconductor memory device 1 includes a wiring board 2 which serves as an element mounting substrate and a terminal formation substrate. For example, the wiring board 2 has a wiring network disposed within and on the surface of an insulating resin substrate, and specifically, a printed circuit board using a glass-epoxy resin, a BT resin (Bismaleimide-Triazine resin) or the like is applied. The wiring board 2 has a first main surface 2a which becomes an element mounting surface and a second main surface 2b which becomes a terminal formation surface.

The wiring board 2 has a substantially rectangular contour. A short side 3A of the wiring board 2 corresponds to a tip end of the memory card when the memory card is inserted into a card slot. Another short side 3B corresponds to a rear end of the memory card. A long side 4A of the wiring board 2 has a linear shape, while another long side 4B has a cutout portion and a recess portion to indicate the front and rear and the front and back sides of the memory card. In addition, each corner of the wiring board 2 has a curved shape (R-shape).

On the second main surface 2b of the wiring board 2 are formed external connection terminals 5 which become input and output terminals of the memory card. The second main surface 2b of the wiring board 2 corresponds to the surface of the memory card. In addition, a second wiring network (not shown) is formed on the second main surface 2b of the wiring board 2 excepting the forming region for the external connection terminals 5. The second wiring network has, for example, a test pad for the memory card. The second wiring network formed on the second main surface 2b is covered with an insulating layer 6 using an insulating adhesive sealing or adhesive tape.

The first main surface 2a of the wiring board 2 has a first wiring network including connection pads 7, which become bonding portions at the time of wire bonding, and an element mounting portion. The first main surface 2a of the wiring board 2 corresponds to the back surface of the memory card. The first wiring network having the connection pads 7 is electrically connected to the external connection terminals 5 and the second wiring network via an unshown internal wiring (through holes and the like) of the wiring board 2.

On the first main surface 2a of the wiring board 2 are stacked first and second semiconductor memory elements 8, 9 sequentially. As the first and second semiconductor memory elements 8, 9, for example, NAND-type flash memories are used. The mounted number of the semiconductor memory elements is not limited to two but maybe three or more. On the second semiconductor memory element 9 is stacked a controller element 10. The controller element 10 writes data received via the external connection terminals 5 into the semiconductor memory elements 8, 9 and reads data which is stored in the semiconductor memory elements 8, 9.

The first semiconductor memory element 8 is adhered to the first main surface 2a of the wiring board 2 via an adhesive layer 11. The second semiconductor memory element 9 is stacked on the first semiconductor memory element 8 via a spacer layer 12. The spacer layer 12 is formed of an insulating resin softened at the time of the adhesion. Thermoplastic resin such as an acryl resin, or thermosetting resin such as an epoxy resin is used as the insulating resin. The first semiconductor memory element 8 and the second semiconductor memory element 9 are adhered by the spacer layer 12 formed of an insulating resin layer (adhesive layer). The controller element 10 is adhered to the second semiconductor memory element 9 via an adhesive layer 13.

The first semiconductor memory element 8 has electrode pads 8a which are arranged along the individual opposite short sides. The first semiconductor memory element 8 has a both short-side-arranged pad structure. Similarly, the second semiconductor memory element 9 has electrode pads 9a which are arranged along the individual opposite short sides. The controller element 10 has electrode pads 10a which are arranged along one short side and one long side which is orthogonal to the short side. The controller element 10 has an L-shaped pad structure.

The electrode pads 8a, 9a of the first and second semiconductor memory elements 8, 9 are electrically connected to the connection pads 7 of the wiring board 2 via first and second metal wires 14, 15. Similarly, the electrode pads 10a of the controller element 10 are electrically connected to the connection pads 7 of the wiring board 2 via third metal wires 16. For the metal wires 14, 15, 16, a thin metal wire such as an ordinary Au wire, Cu wire or the like is used.

The first metal wires 14 are wire bonded by applying reverse bonding. In other words, metal bumps 17 are formed on the first electrode pads 8a. One end of each of the first metal wires 14 is ball connected to each of the connection pads 7 of the wiring board 2, and the other end is connected to each of the metal bumps 17 formed on the first electrode pads 8a. The second metal wires 15 are also connected in the same manner. One end of each of the second metal wires 15 is ball connected to each of the connection pads 7 of the wiring board 2, and the other end is connected to each of the metal bumps 17 formed on the second electrode pad 9a.

The end portions (element side end portions) of the first metal wires 14 connected to the first electrode pads 8a are buried in the spacer layer 12 to prevent their contact with the second semiconductor memory element 9. The first metal wires 14 are separated from the bottom surface of the second semiconductor memory element 9 by the thickness (the distance between the first semiconductor memory element 8 and the second semiconductor memory element 9) of the spacer layer 12. The thickness of the spacer layer 12 is preferably in a range of 30 to 100 µm, and more preferably in a range of 50 to 80 µm.

In order to prevent more securely the contact between the element side end portions of the first metal wires 14 and the second semiconductor memory element 9, the spacer layer 12 may have a first resin layer (adhesive layer) which is softened or melted at an adhering temperature, and a second resin layer (insulating layer) which maintains the layer shape at the adhering temperature. The element side end portions of the first metal wires 14 are incorporated into the first resin layer, which is disposed on the side of the first semiconductor memory element 8, and prevented from a contact with the second semiconductor memory element 9 by the second resin layer which is disposed on the side of the second semiconductor memory element 9.

The first metal wires 14 are disposed within the spacer layer 12, and it is necessary to make the loop height (specifically, height from the first semiconductor memory element 8) smaller than the thickness of the spacer layer 12. Therefore, the reverse bonding capable of decreasing the loop height is applied to the first metal wires 14. In a case where normal bonding is applied to the first metal wires 14, a readily contact with the second semiconductor memory element 9 tends to occur or it is necessary to increase the thickness of the spacer layer 12 to prevent a contact with the second semiconductor memory element 9.

The reverse bonding is also applied to the third metal wires 16. One end of each of the third metal wires 16 is ball connected to each of the connection pads 7 of the wiring board 2, and the other end is connected to each of the metal bumps 17 formed on the third electrode pads 10a. The third metal wires 16 have a longer loop in comparison with the first and second metal wires 14, 15. Therefore, the reverse bonding, that the loop height can be decreased and the wires can be suppressed from being deformed or fallen when the wires have a long loop, is also applied to the third metal wires 16.

On the first main surface 2a of the wiring board 2, where the semiconductor memory elements 8, 9 and the controller element 10 are mounted, is mold-formed a sealing resin layer 18 which is formed of, for example, an epoxy resin. The semiconductor memory elements 8, 9 and the controller element 10 are integrally sealed together with the metal wires 14, 15, 16 by the sealing resin layer 18. A slope part 19 is formed on a tip end of the sealing resin layer 18. A holding part 20 is formed on the rear end part of the sealing resin layer 18 by partly raising the sealing resin. Thus, the semiconductor memory device 1 which is used as a casing-free memory card is configured. The sealing resin layer 18 is omitted in FIG. 1.

The semiconductor memory device 1 of this embodiment solely configures a semiconductor memory card (e.g., Micro SD™ card) without using a casing such as a base card. Therefore, the insulating layer 6 and the sealing resin layer 18 are directly exposed externally. In other words, the semiconductor memory device 1 is a casing-free memory card which has the insulating layer 6 and the sealing resin layer 18 exposed externally. Therefore, a cutout portion and a recess portion which indicate the front and rear and the front and back sides of the above-described memory card are formed on the semiconductor memory device 1 itself.

In a case where a casing-free Micro SD™ card is configured by the semiconductor memory device 1, the semiconductor memory device 1 is determined to have thickness (card thickness) T of, for example, 700 μm or less. Stacked thickness of the semiconductor memory elements 8, 9 and the controller element 10 stacked is required to fall in a range of card thickness T with the thickness of the wiring board 2 added. To satisfy such conditions, the semiconductor memory elements 8, 9 must be made thinner, but when the semiconductor memory elements 8, 9 are simply made thinner, there is a possibility of causing a crack at the time of mold forming of the sealing resin layer 18.

Figure 5:
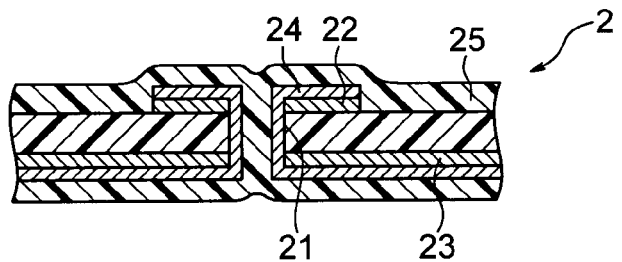
FIG. 5 is a sectional view showing a partly magnified view of the wiring board of the semiconductor memory device shown in FIG. 1.

It is presumed that the occurrence of a crack at the time of mold forming of the semiconductor memory elements 8, 9 results from the following causes. Specifically, the surface of the wiring board 2 has irregularities due to a stepped portion because of the presence or not of a wiring layer, a stepped portion because of through hole portions, a stepped portion because of terminals or test pads, or the like. FIG. 5 shows a through hole portion of the wiring board 2. In FIG. 5, 21 is a through hole, 22 is a land-shaped wiring layer on the side of the first main surface 2a of the wiring board 2, 23 is a wiring layer on the side of the second main surface 2b, 24 is a plated layer, and 25 is a solder resist layer. The solder resist layer 25 has a convex portion due to the land-shaped wiring layer 22 and the plated layer 24 formed thereon.

The first semiconductor memory element 8 is arranged on the uneven portion of the wiring board 2, and mold forming of the sealing resin layer 18 is performed in the above-described state. At the time of the mold forming of the sealing resin layer 17, a pressure is applied to the semiconductor memory elements 8, 9. Especially, a high pressure due to the uneven portion of the wiring board 2 is locally applied to the first semiconductor memory element 8 on a lower side in contact with the wiring board 2. Therefore, if the first semiconductor memory element 8 is thin, it is cracked because of the local pressure applied at the time of the mold forming.

Thus, the first semiconductor memory element 8 tends to crack due to the uneven portion of the wiring board 2 at the time of the mold forming. The cause of the crack in the first semiconductor memory element 8 is not limited to the uneven portion of the first main surface 2a which is an element mounting surface. Where the uneven portion is present on the second main surface 2b opposite to the element mounting surface (the first main surface 2a) of the wiring board 2, the local pressure at the time of mold forming is applied to the first semiconductor memory element 8 via the wiring board 2, so that there is a possibility that the first semiconductor memory element 8 is cracked. In a case where at least one of the first and second main surfaces 2a, 2b of the wiring board 2 has un uneven portion, the first semiconductor memory element 8 tends to be cracked.

Accordingly, the semiconductor memory device 1 of this embodiment has thickness T1 of the first semiconductor memory element 8 on a lower side determined to be greater than thickness T2 of the second semiconductor memory element 9 on an upper side. For mere suppression of a crack in the semiconductor memory elements 8, 9, the thickness T1 of the first semiconductor memory element 8 may be increased, and at the same time, the thickness T2 of the second semiconductor memory element 9 is determined to be equal to the thickness T1. But, a stacked thickness (T1+T2) of the semiconductor memory elements 8, 9 also becomes thick, and the card thickness T (e.g., 700 μm or less) cannot be satisfied.

Therefore, only the thickness T1 of the first semiconductor memory element 8 to which a local pressure is directly applied at the time of the mold forming is increased, and the thickness T2 of the second semiconductor memory element 9 which is not cracked easily at the time of the mold forming is decreased to be smaller than the thickness T1 (T1>T2) to prevent the stacked thickness (T1+T2) of the semiconductor memory elements 8 and 9 from becoming thick. In this embodiment, the spacer layer 12 is disposed between the semiconductor memory elements 8 and 9, so that the stacked thickness of the semiconductor memory elements 8 and 9 includes the thickness of the spacer layer 12. Therefore, to satisfy the card thickness T (e.g., 700 μm or less), it is important to decrease the thickness T2 of the second semiconductor memory element 9.

The thickness T1 of the first semiconductor memory element 8 and the thickness T2 of the second semiconductor memory element 9 are determined to be T1>T2, so that the stacked thickness of the semiconductor memory elements 8, 9 is decreased to satisfy the conditions of the card thickness T, and the semiconductor memory elements 8, 9 can be suppressed from being cracked at the time of the mold forming. Specifically, the thickness T1 of the first semiconductor memory element 8 is preferably in a range of 80 to 150 μm. If the thickness T1 is less than 80 μm, the crack of the first semiconductor memory element 8 cannot be suppressed with a good reproducibility. If the thickness T1 exceeds 150 μm, the total thickness becomes excessively thick even if the thickness T2 of the second semiconductor memory element 9 is decreased.

Specifically, the thickness T2 of the second semiconductor memory element 9 is preferably in a range of 50 to 100 μm. In this case, T1>T2 is an essential condition. If the thickness T2 exceeds 100 μm, the semiconductor memory elements 8, 9 have an excessively large stacked thickness. Accordingly, the thickness T2 is more preferably determined to be 70 μm or less. It is hard to decrease the thickness T2 to less than 50 μm in view of the semiconductor device production process, and even if decreased, a crack is caused easily. But, the thickness T2 may be less than 50 μm if the function and strength of the semiconductor memory element can be satisfied.

As described above, it is desired that the first and second semiconductor memory elements 8, 9 satisfy the conditions of T1>T2, T1=80 to 150 μm and T2=50 to 100 μm (further 50 to 75 μm). By satisfying the above conditions, both the reduction of the stacked thickness of the semiconductor memory elements 8, 9 and the prevention of a crack can be satisfied in addition to the provision of a high capacity by stacking the plural semiconductor memory elements 8, 9. In other words, the production yield and reliability of the thin and high-capacity semiconductor memory device 1 can be enhanced.

The arrangement of the semiconductor memory elements 8, 9 and the controller element 10 is described below. As described above, the first and second semiconductor memory elements 8, 9 each have a both short-side-arranged pad structure. The first and second semiconductor memory elements 8, 9 are disposed with their long sides parallel to the long sides of the wiring board 2. In addition, the second semiconductor memory element 9 is stacked on the first semiconductor memory element 8 in a state displaced in the short-side direction. In other words, the first and second semiconductor memory elements 8, 9 are stacked with their short sides aligned and the long sides in a step-like state.

When the second semiconductor memory element 9 is disposed on the first semiconductor memory element 8 in a state displaced in the short-side direction (the arrangement direction of electrode pads), the electrode pads 8a of the first semiconductor memory element 8 and the electrode pads 9a of the second semiconductor memory element 9 are positioned in a state displaced in the arrangement direction. Therefore, the first and second metal wires 14, 15 can be wired displaced in the arrangement direction of the electrode pads. Even when the area (region where the connection pads 7 are formed) between the short sides of the wiring board 2 and the short sides of the semiconductor memory elements 8, 9 is small and limited, good wire bonding can be performed on the stacked semiconductor memory elements 8, 9.

As described above, the controller element 10 has the L-shaped pad structure. In addition, the controller element 10 has an elongate rectangular shape smaller than the semiconductor memory elements 8, 9. The controller element 10 is disposed such that its long sides are parallel to the long sides of the semiconductor memory elements 8, 9. In FIG. 1, arrow X indicates an ultrasonic-wave application direction (a load direction of ultrasonic waves applied to the metal balls by a bonder) at the time of bonding the metal wires 14, 15, 16. When bonding, ultrasonic waves are applied in the long-side directions of the semiconductor memory elements 8, 9. Therefore, the controller element 10 is disposed with its long sides in parallel to the ultrasonic-wave application direction X.

The controller element 10 having an elongate rectangular shape is disposed with its long sides in parallel to ultrasonic-wave application direction X at the time of wire bonding. To perform wire bonding on the controller element 10, ultrasonic waves are applied in the long-side direction of the elongate-shaped controller element 10. Thus, the bonding property of the metal wires 16 to the controller element 10 which has a small and elongate shape can be improved. In addition, the adhered state of the controller element 10 can be maintained stably.

When the wire bonding is performed while applying ultrasonic waves in a direction parallel to the short sides of the controller element 10, the controller element 10 shows a bending behavior in the short-side direction when bonding, so that bonding strength of the bonding wires (particularly, several wires just after the start of bonding) is degraded. It becomes a cause of degrading the reliability of connection to the controller element 10. Meanwhile, when the wire bonding is performed by applying ultrasonic waves in a direction parallel to the long sides of the controller element 10, the bonding strength of the metal wires 16 can be improved. In addition, it becomes possible to stably maintain the adhered state of the controller element 10.

The semiconductor memory device 1 of this embodiment is effective for the casing-free memory card, which is configured independently, but does not necessarily exclude a memory card using a casing such as a base card. In a case where the semiconductor memory device is housed in a casing to configure the memory card, the semiconductor memory elements may be stacked into multiple layers in order to provide the memory card with a high-capacity. In such a case, the semiconductor memory device 1 of the embodiment can be applied.

A production process of the semiconductor memory device 1 will be described below. First, a board frame having plural device forming regions (memory card forming regions) is prepared. The plural device forming regions each correspond to the wiring board 2. Electrolytic plating is applied to the individual device forming regions of the board frame to form the external connection terminals 5. The connection pads are also formed by electrolytic plating if necessary. The external connection terminals 5 are formed on the second main surface of the board frame corresponding to the second main surface 2b of the wiring board 2.

Then, the first semiconductor memory element 8 is mounted on the first main surface (corresponding to the first main surface 2a of the wiring board 2) of the board frame. Wire bonding is performed on the first semiconductor memory element 8 by reverse bonding. In addition, the second semiconductor memory element 9 is stacked on the first semiconductor memory element 8. The second semiconductor memory element 9 has on the bottom surface an insulating resin film, which becomes the spacer layer 12, and is stacked on the first semiconductor memory element 8 while including the element side end portions of the first metal wires 14 into the spacer layer 12.

Wire bonding is performed on the second semiconductor memory element 9 by reverse bonding. In addition, the controller element 10 is stacked thereon, and wire bonding is performed by reverse bonding. The individual elements 8, 9, 10 are arranged as shown in FIG. 1. Wire bonding to the controller element 10 is performed with the ultrasonic-wave application direction x parallel to the long-side direction of the elongate controller element 10. Mounting and wire bonding of the individual elements 8, 9, 10 are performed to the individual device forming regions of the board frame.

Subsequently, the sealing resin layer 18 is mold-formed on the side of the first main surface of the board frame. In the resin molding process, the sealing resin layer 18 is mold-formed by a transfer mold method or the like to collectively seal the semiconductor memory elements 8, 9 and the controller element 10 which are mounted on the plural device forming regions. The holding part 20 is also formed by partly raising the sealing resin layer 18 at the time of mold forming of the sealing resin layer 18.

Figure 6A:
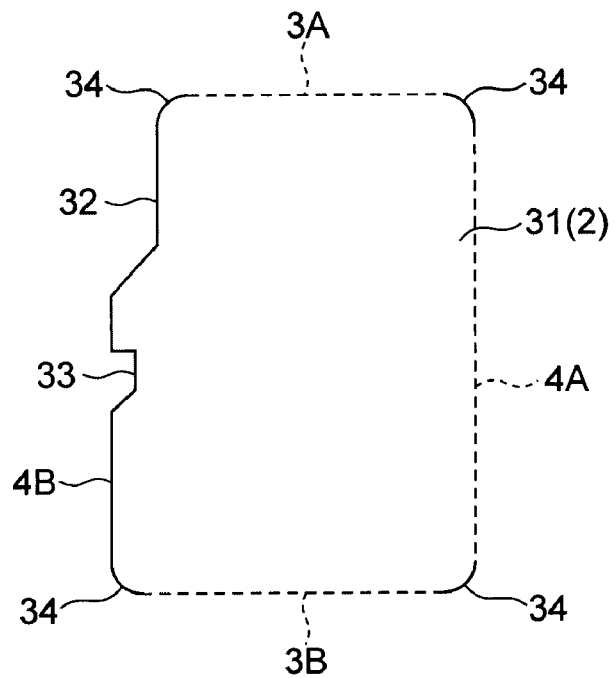
FIG. 6A and FIG. 6B are plan views showing a board frame cutting process in a production process of the semiconductor memory device shown in FIG. 1.

The board frame is sent to a cutting process and cut together with the sealing resin layer. The board frame cutting process will be described with reference to FIG. 6A and FIG. 6B. In the drawings, 31 denotes a device forming region (corresponding to the wiring board 2) of the board frame, 32 denotes a cutout portion, 33 denotes a recess portion, and 34 denotes R-shaped corner portions. First, as shown in FIG. 6A, a long side 4B having the cutout portion 32 and the recess portion 33 and the individual corner portions 34 of the device forming region 31 are laser fabricated. In the drawing, solid lines indicate cutout portions formed by laser fabrication. Thus, the laser fabrication is applied to cutting of curved part-including portions.

Figure 6B:
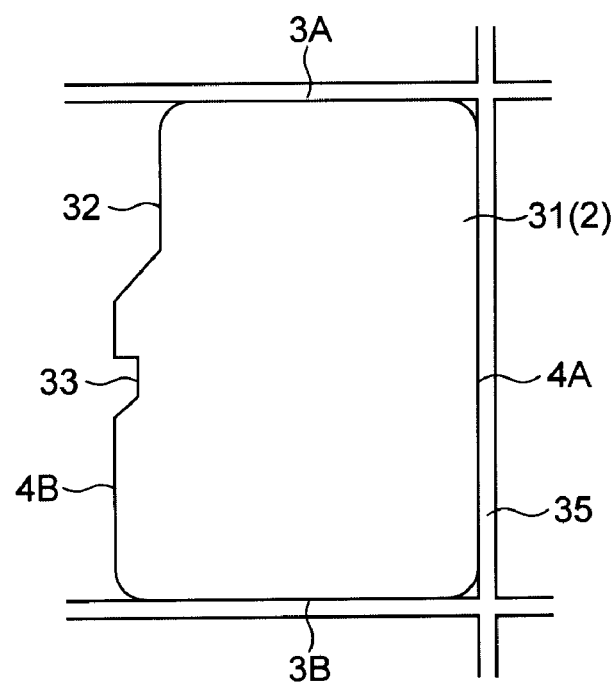

Then, as shown in FIG. 6B, short sides 3A, 3B and long side 4A of the device forming region 31 are subjected to blade dicing. These sides 3A, 3B, 4A are linear excepting the corner portions 34, so that the blade dicing having a high cutting speed can be applied. Reference numeral 35 denotes a cutting line to be cut by blade dicing. Thus, the blade dicing having a high cutting speed is applied to cut the linear sides, and the laser fabrication is applied to only fabrication of the sides including the curved parts and the corner portions, thereby cutting efficiency can be enhanced.

Figure 7:
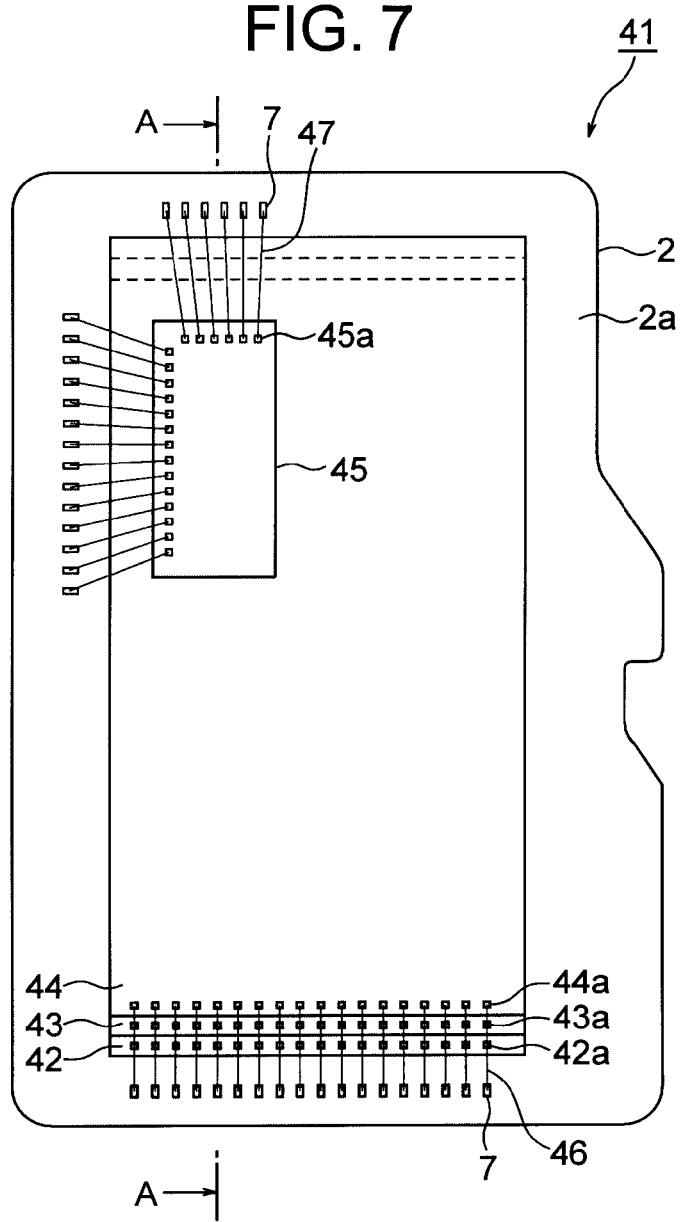
FIG. 7 is a plan view showing the semiconductor memory device according to a second embodiment of the invention.
Figure 8:
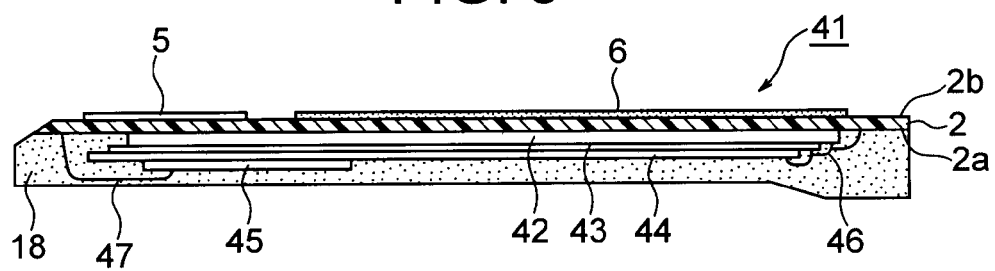
FIG. 8 is a sectional view taken along line A-A of FIG. 7.

A second embodiment of the invention is described below. FIG. 7 and FIG. 8 show a structure of the semiconductor memory device of the second embodiment. Like parts as those of the first embodiment are denoted by like reference numerals, and detailed descriptions thereof will be omitted partly. A semiconductor memory device 41 shown in FIGS. 7 and 8 configures the semiconductor memory card in the same manner as in the first embodiment, and the semiconductor memory device 41 is solely used as a memory card (Micro SD™ card) according to the Micro SD™ standard.

The first main surface 2a of the wiring board 2 has a first wiring network including the connection pads 7 and an element mounting portion. The external connection terminals 5 which become input and output terminals of the memory card is formed on the second main surface 2b of the wiring board 2. First, second and third semiconductor memory elements 42, 43, 44 are stacked sequentially on the first main surface 2a of the wiring board 2. The mounted number of the semiconductor memory elements is not limited to three but may be four or more. A controller element 45 is stacked on the third semiconductor memory element 44.

The first through third semiconductor memory elements 42, 43, 44 each have electrode pads 42a, 43a, 44a which are arranged along one short side. The semiconductor memory elements 42, 43, 44 have a one short-side-arranged pad structure. The controller element 45 has electrode pads 45a which are arranged along one short side and one long side which is orthogonal to the short side. The controller element 45 has an L-shaped pad structure.

The first, second and third semiconductor memory elements 42, 43, 44 are arranged such that their long sides are parallel to the long sides of the wiring board 2. In addition, the second semiconductor memory element 43 is stacked on the first semiconductor memory element 42 in a state displaced in its long side direction (direction orthogonal to the arrangement direction of the electrode pads 43a). Similarly, the third semiconductor memory element 44 is stacked on the second semiconductor memory element 43 in a state displaced in its long side direction (direction orthogonal to the arrangement direction of the electrode pads 44a). The first, second and third semiconductor memory elements 42, 43, 44 are stacked with their long sides aligned and the short sides in a step-like state.

The first semiconductor memory element 42 on the bottom side has thickness T1 which is determined to be greater than thicknesses T2, T3 of the second and third semiconductor memory elements 43, 44. Only the thickness T1 of the first semiconductor memory element 42, to which a local pressure is directly applied at the time of mold forming, is determined to be thick, and the thicknesses T2, T3 of the second and third semiconductor memory elements 43, 44 which are not easily cracked at the time of mold forming are determined to be smaller than the thickness T1. The thickness T1 of the first semiconductor memory element 42 is preferably in a range of 80 to 150 μm in the same manner as in the first embodiment. The thicknesses T2, T3 of the second and third semiconductor memory elements 43, 44 are preferably in a range of 50 to 100 μm.

It is preferable that the first, second and third semiconductor memory elements 42, 43, 44 satisfy conditions of T1>T2, T3, T1=80 to 150 μm, T2, T3=50 to 100 μm (further, 50 to 75 μm). By satisfying the above conditions, the plural semiconductor memory elements 42, 43, 44 are stacked to provide a high capacity, and both the reduction of the stacked thickness of the semiconductor memory elements 42, 43, 44 and the suppression of a crack can be satisfied. In other words, the production yield and reliability of the thin and high-capacity semiconductor memory device 41 can be improved.

In addition, the semiconductor memory elements 42, 43, 44 having a one short-side-arranged pad structure are stacked in a state displaced in the long side direction to expose the individual electrode pads 42a, 43a, 44a. Therefore, the individual electrode pads 42a, 43a, 44a and the connection pads 7 can be connected electrically via metal wires 46 without applying the spacer layer as in the first embodiment. The spacer layer has a thickness greater than that of an ordinary die bonding film, so that the number of stacked semiconductor memory elements can be increased without applying the spacer layer.

The individual electrode pads 42a, 43a, 44a are exposed in the step-like state, so that the electrode pads 42a, 43a, 44a having the same electrical characteristics and signal characteristics of the individual semiconductor memory elements 42, 43, 44 can be connected sequentially by the metal wires 46. In this case, the individual electrode pads (between 43a and 44a and between 43a and 42a) are connected by the metal wires 46 respectively, and the electrode pads 42a and the connection pads 7 are finally connected by the metal wires 46. The metal wires 46 between the individual pads are formed by separately performing the wire bonding process. Otherwise, the individual pads can be connected sequentially by means of a single metal wire 46.

The controller element 45 has an elongate shape smaller than the semiconductor memory elements 42, 43, 44. The controller element 45 is arranged with its long sides in parallel to the long sides of the semiconductor memory elements 42, 43, 44. Electrode pads 45a of the controller element 45 are electrically connected to the connection pads 7 of the wiring board 2 via the metal wires 47. The controller element 45 is arranged with the long sides in parallel to the direction of ultrasonic waves applied at the time of bonding of the metal wires 47 in the same manner as in the first embodiment.

The semiconductor memory device of the invention is not limited to the above-described embodiments but can be applied to various types of semiconductor memory devices having plural semiconductor memory elements stacked and mounted on the wiring board. The present invention is not limited to the semiconductor memory device for the semiconductor memory card. The semiconductor memory card of the invention is not limited either. The specific structures of the semiconductor memory device and the semiconductor memory card of the invention can be modified in various ways if the basic structure of the invention is satisfied. In addition, the described embodiments may be expanded or modified without departing from the technical idea of the invention, and all expanded or modified embodiments are also intended to be embraced therein.

What is claimed is:

1. A semiconductor memory device, comprising:

a wiring board including a first main surface which has an element mounting portion, connection pads and a wiring layer, and a second main surface which is on an opposite of the first main surface;

a first semiconductor memory element which is mounted on the element mounting portion of the wiring board and has first electrode pads;

a second semiconductor memory element which is stacked on the first semiconductor memory element and has second electrode pads;

metal wires which electrically connect the connection pads of the wiring board and the first and second electrode pads of the first and second semiconductor memory elements; and a sealing resin layer which is formed on the first main surface of the wiring board to seal the first and second semiconductor memory elements together with the metal wires, wherein the first main surface of the wiring board has a convex portion on the wiring layer, and the first semiconductor memory element is adhered to the first main surface of the wiring board via an adhesive layer, wherein the first semiconductor memory element has a thickness greater than that of the second semiconductor memory element, and wherein a sloped face is formed on ends of the wiring board and the sealing resin layer so that the first main surface of the wiring board is larger than the second main surface of the wiring board and an upper surface of the sealing resin layer is larger than the first main surface of the wiring board, and a side portion of the sealing resin layer is composed of a face perpendicular to the upper surface and the sloped face.

2. The semiconductor memory device according to claim 1, wherein the first semiconductor memory element has a thickness T1, the second semiconductor memory element has a thickness T2, and the first and second semiconductor memory elements satisfy conditions of T1>T2, T1=80 to 150 μm and T2=50 to 100 μm.

3. The semiconductor memory device according to claim 1, further comprising:
a controller element stacked on the second semiconductor memory element; and
metal wires which electrically connect the connection pads of the wiring board and electrode pads of the controller element.

4. The semiconductor memory device according to claim 3, wherein the controller element has an elongate rectangular shape smaller than the first and second semiconductor memory elements and is arranged with its long sides in parallel to a direction of ultrasonic waves applied at the time of connection of the metal wires.

5. The semiconductor memory device according to claim 1, wherein the second semiconductor memory element is stacked on the first semiconductor memory element via a spacer layer formed of an insulating resin layer, and end portions of the metal wires connected to the first electrode pads are buried in the spacer layer.

6. The semiconductor memory device according to claim 1, wherein one end of a metal wire is ball connected to one of the connection pads, and the other end is connected to a metal bump formed on one of the electrode pads.

7. The semiconductor memory device according to claim 1, wherein the first electrode pads are arranged along two opposed sides of the first semiconductor memory elements, and the second electrode pads are arranged along two opposed sides of the second semiconductor memory elements, and the first and second semiconductor memory elements are stacked in a state displaced in a direction parallel to the sides.

8. The semiconductor memory device according to claim 1, wherein the first and second electrode pads are arranged along one side of each of the first and second semiconductor memory elements, and the first and second semiconductor memory elements are stacked in a state displaced in a direction orthogonal to the side.

9. The semiconductor memory device according to claim 1, further comprising:
a third semiconductor memory element which is stacked on the second semiconductor memory element; and
a controller element which is stacked on the third semiconductor memory element.

10. The semiconductor memory device according to claim 1,
wherein the first semiconductor memory element is disposed on the convex portion only via the adhesive layer.

11. A semiconductor memory card, comprising:
a wiring board including a first main surface which has an element mounting portion, connection pads and a wiring layer, and a second main surface which is on an opposite of the first main surface;
an external connection terminal which are formed on the second main surface of the wiring board;
a first semiconductor memory element which is mounted on the element mounting portion of the wiring board and has first electrode pads;
a second semiconductor memory element which is stacked on the first semiconductor memory element and has second electrode pads;
a controller element which is stacked on the second semiconductor memory element and has third electrode pads;
first metal wires which electrically connect the connection pads of the wiring board and the first and second electrode pads of the first and second semiconductor memory elements;
second metal wires which electrically connect the connection pads of the wiring board and the third electrode pads of the controller element; and
a sealing resin layer which is formed on the first main surface of the wiring board to seal the first and second semiconductor memory elements and the controller element together with the first and second metal wires,
wherein the first main surface of the wiring board has a convex portion on the wiring layer, and the first semiconductor memory element is adhered to the first main surface of the wiring board via an adhesive layer,
wherein the first semiconductor memory element has a thickness greater than that of the second semiconductor memory element, and
wherein a sloped face is formed on ends of the wiring board and the sealing resin layer so that the first main surface of the wiring board is larger than the second main surface of the wiring board and an upper surface of the sealing resin layer is larger than the first main surface of the wiring board, and a side portion of the sealing resin layer is composed of a face perpendicular to the upper surface and the sloped face.

12. The semiconductor memory card according to claim 11,
wherein the first semiconductor memory element has a thickness T1, the second semiconductor memory element has a thickness T2, and the first and second semiconductor memory elements satisfy conditions of T1>T2, T1=80 to 150 μm and T2=50 to 100 μm.

13. The semiconductor memory card according to claim 11,
wherein the second semiconductor memory element is stacked on the first semiconductor memory element via a spacer layer formed of an insulating resin layer, and end portions of the first metal wires connected to the first electrode pads are buried in the spacer layer.

14. The semiconductor memory card according to claim 11,
wherein one end of a metal wire is ball connected to one of the connection pads, and the other end is connected to a metal bump formed on one of the electrode pads.

15. The semiconductor memory card according to claim 11,
wherein the first electrode pads are arranged along two opposed sides of the first semiconductor memory element, and the second electrode pads are arranged along two opposed sides of the second semiconductor memory element, and the first and second semiconductor memory elements are stacked in a state displaced in a direction parallel to the sides.

16. The semiconductor memory card according to claim 11,
wherein the first and second electrode pads are arranged along one side of each of the first and second semiconductor memory elements, and the first and second semiconductor memory elements are stacked in a state displaced in a direction orthogonal to the side.

17. The semiconductor memory card according to claim 11, further comprising:
a third semiconductor memory element which is disposed between the second semiconductor memory element and the controller element.

18. The semiconductor memory card according to claim 11,
wherein the controller element has an elongate rectangular shape smaller than the first and second semiconductor memory elements and is arranged with its long sides in parallel to a direction of ultrasonic waves applied at the time of connection of the second metal wires.

19. The semiconductor memory card according to claim 11,
wherein the wiring board includes an insulating layer which covers the second main surface excepting a region for forming the external connection terminal, and the insulating layer and the sealing resin layer are exposed externally.

20. The semiconductor memory card according to claim 11,
wherein the first semiconductor memory element is disposed on the convex portion only via the adhesive layer.

* * * * *